United States Patent [19]
Chin et al.

[11] Patent Number: 5,637,387
[45] Date of Patent: Jun. 10, 1997

[54] STORAGE-STABLE ADVANCED POLYMALEIMIDE COMPOSITIONS

[75] Inventors: Benjamin G. Chin, Croton-on-Hudson; Roger Tietze, Baldwin, both of N.Y.

[73] Assignee: Ciba-Geigy Corporation, Tarrytown, N.Y.

[21] Appl. No.: 462,438

[22] Filed: Jun. 2, 1995

Related U.S. Application Data

[63] Continuation of Ser. No. 241,216, May 10, 1994, abandoned, which is a continuation-in-part of Ser. No. 117,886, Sep. 7, 1993, abandoned, which is a continuation of Ser. No. 709,906, Jun. 3, 1991, abandoned.

[51] Int. Cl.$^6$ .................................................. B32B 27/00
[52] U.S. Cl. .................. 442/149; 442/180; 427/389.8; 428/365; 428/375; 428/377; 428/290; 428/396; 428/435; 428/473.5; 524/83; 524/233; 524/317; 524/347; 524/361; 524/363; 524/364; 524/375; 524/376; 524/378; 525/422; 526/262; 528/322
[58] Field of Search .................. 525/422; 526/262; 528/322; 524/83, 233, 317, 347, 361, 363, 364, 375, 376, 378; 428/365, 395, 396, 435, 473.5, 290, 375, 377, 245; 427/389.8

[56] References Cited

U.S. PATENT DOCUMENTS

| | | | |
|---|---|---|---|
| 4,100,140 | 7/1978 | Zahir et al. | 526/90 |
| 4,127,615 | 11/1978 | Zahir et al. | 260/837 |
| 4,130,600 | 12/1978 | Zahir et al. | 260/830 |
| 4,131,632 | 12/1978 | Suzuki et al. | 260/834 |
| 4,371,719 | 2/1983 | Zahir et al. | 568/723 |
| 4,826,927 | 5/1989 | Schmid et al. | 525/422 |
| 4,927,907 | 5/1990 | Corley | 528/322 |
| 5,070,154 | 12/1991 | Shiobara et al. | 525/422 |
| 5,077,363 | 12/1991 | Eisenbarth et al. | 526/262 |
| 5,189,128 | 2/1993 | Maw et al. | 526/262 |

*Primary Examiner*—Judy M. Reddick
*Attorney, Agent, or Firm*—Michele A. Kovaleski

[57] ABSTRACT

The present invention relates to storage-stable advanced polymaleimide compositions and prepreg products manufactured therefrom comprising (A) an advanced polymaleimide reaction product resulting from the advancement reaction of a polyimide and an alkenyl phenol; and (B) a phenothiazine added to component (A) after advancement.

24 Claims, No Drawings

STORAGE-STABLE ADVANCED POLYMALEIMIDE COMPOSITIONS

This application is a continuation, of application Ser. No. 08/241,216, filed May 10, 1994 now abandoned, which is a continuation in part of Ser. No. 08/117,886 filed Sep. 7, 1993 now abandoned, which is a continuation of Ser. No. 07/709,906 filed Jun. 3, 1991 now abandoned.

BACKGROUND OF THE INVENTION

It is known that polymaleimides can be utilized for the preparation of various polyaddition and polymerization products. Particular emphasis has been placed on bismaleimide materials which exhibit thermal stability and good mechanical properties and, thus, are being more frequently utilized in high performance composite applications, such as electronic circuit board applications.

The currently used bis-maleimide systems include aromatic amines or alkenyl phenols as coreactants. U.S. Pat. Nos. 3,658,764 and Re. 29,316 are examples of patents that disclose reaction products of unsaturated bis-imides and amines. U.S. Pat. Nos. 4,100,140; 4,127,615; 4,130,600; 4,131,632; 4,371,719; and 5,077,363 are examples of patents which disclose crosslinked polymers resulting from the reaction of polymaleimides with alkenyl phenols or alkenyl phenol ethers optionally in the presence of epoxy resins. U.S. Pat. No. 4,038,251 discloses polyamide/polyhydric phenol reaction products prepared in the presence of amines.

A standard polyimide product conventionally used for various pre-peg applications comprises the reaction product of bismaleimidodiphenyl methane with methylene dianiline. The product is supplied as a solid powder to be dissolved in N-methylpyrrolidone for prepreg use. It has been noted, however, that the product is soluble only in the above-noted solvent or similar high boiling, difficult to process aprotic solvents. Correspondingly, solution stability of these systems is limited as evidenced by rapidly occurring precipitation and viscosity increases on standing. These factors necessitate that the prepolymer be formulated immediately prior to use.

Improvements in the above systems are noted in the products disclosed by U.S. Pat. Nos. 4,100,140 and 4,371,719, as cited above. U.S. Pat. No. 4,100,140 discloses improved products, based primarily on the reaction of bis-maleimidodiphenyl methane and diallyl bisphenol A prepared in the optional presence of amine polymerization catalysts, which exhibit improved thermal, chemical and mechanical properties. Still further, U.S. Pat. No. 4,371,710 discloses improved products, based primarily on the reaction of maleimides with phenol containing at least one propenyl group, with the advancement being that products containing a propenyl-substituted phenol cure at a faster rate than those containing an allyl-substituted phenol. However, both of the aforementioned systems still have certain disadvantages in terms of storage-stability and limited solubility. For example, the systems are insoluble in conventional ketonic solvents and, when stored in higher boiling solvent solution, precipitate out of solution after short periods of time. Consequently, the products normally must be stored at refrigerated temperatures due not only to the instability of the solution but also to advancement of the resin systems at higher temperatures. Accordingly, their applicability for use in making solvent impregnated laminates is limited.

Elimination of some of the disadvantages as mentioned above is described in U.S. Pat. No. 5,189,128 wherein polymaleimide prepolymers are obtained by reaction of a polymaleimide with an alkylphenol or alkenyl phenol ether in the presence of specified molar amounts of a basic catalyst at elevated temperatures in order to obtain a predetermined amount of resin advancement. The resulting resin solutions exhibit improved solubility in relatively low boiling solvents such as methyl ethyl ketone and propylene glycol methyl ether and improved resin solution stability as evidenced by an absence of precipitation of the resin from solution. However, difficulty in obtaining a storage-stable advanced bismaleimide prepolymer product may still be encountered when using these resin solutions due to further polymerization of the prepolymer at room-temperature conditions. More importantly, a storage-stable prepreg product cannot be manufactured therefrom, resulting in a decrease in resin flow in the lamination process as the storage age increases. If the resin flow decreases too far, the bond strength will decrease, which leads eventually to delamination. Moreover, as the resin flow increases over time during storage, the manufacturing process must be accordingly readjusted. Thus, it becomes very important to the user of the prepreg product to be able to store said product without reducing resin flow. Generally, refrigeration must be used, which is an additional expense and not always available to users of the prepreg product.

U.S. Pat. No. 5,077,363 discloses a heat-curable bismaleimide prepolymer resin containing bismaleimide, alkenylphenol and a specified amount of N-vinylpyrrolidone, whereby addition of the N-vinylpyrrolidone results in a low viscosity resin solution and an improvement in tack for prepreg products made therefrom. The unpolymerized mixtures containing the bismaleimide, the alkenylphenol and the N-vinylpyrrolidone, that is before any resin advancement whatsoever occurs, may additionally contain inhibitors such as hydroquinone, benzoquinone and phenothiazine. Such inhibitors may be added to the unreacted mixture to control or slow the rate of polymerization once polymerization is initiated. However, the advanced polymaleimide products obtained therefrom do not result in storage-stable prepreg products manufactured therefrom and hence, lead to the same problems as described hereinabove.

Similarly, it is noted in U.S. Pat. No. 4,371,719, discussed supra, that inhibitors may be added to unpolymerized mixtures containing a maleimide and propenyl-substituted phenol in order to retard the degree of resin polymerization. Unfortunately, the disadvantages encountered above, namely failure to achieve a storage-stable advanced polymaleimide prepolymer before prepregging operations, may be likewise encountered. Further, a storage-stable prepreg cannot be made therefrom, which leads to the same attendant difficulties as discussed above.

Therefore, it is the primary object of the present invention to provide a storage-stable advanced polymaleimide composition from which to manufacture storage-stable prepreg products which substantially eliminates the disadvantages encountered with prior art materials.

It is a further object to provide such a storage-stable advanced polymaleimide composition without any substantial adverse impact on the thermal and mechanical properties of the prepreg products made therefrom.

Various other objects and advantages of this invention will become apparent from the following descriptive material.

It has now been surprisingly discovered that the addition of phenothiazine or hydroquinone to the already advanced polymaleimide prepolymer in accordance with the present invention inhibits the further advancement reaction, thereby eliminating or greatly reducing further polymerization and thus, substantially improves the storage-stability of these compositions.

When the phenothiazine or hydroquinone is added is critical to the present invention. If added to the monomer mixture before prepolymerization, it will react with the bismaleimide/diallyl phenol monomers, which results in the phenothiazine being reacted in and hence, not available as an antioxidant in the prepolymer prepreg product. In contrast, the addition of phenothiazine or hydroquinone after advancement surprisingly leads to advanced polymaleimide compositions which can be stored at room temperature for prolonged periods of time without adverse effects to processing conditions, thereby eliminating the problems associated with prior art materials such as the user's need to store such resin systems at low temperatures, i.e., refrigeration conditions.

Furthermore, the addition of the phenothiazine or hydroquinone after advancement surprisingly improves other processing characteristics of the resin system. For example, the pot-life of the resin system in accordance with the present invention is extended improving the processability for the prepreg manufactured therefrom, and the residual volatile content is reduced. Thus, the advanced polymaleimide compositions in accordance with the present invention provide improved coating and processing conditions for higher quality materials.

SUMMARY OF THE INVENTION

The present invention relates to a storage-stable advanced polymaleimide composition comprising:

A) the advanced polymaleimide reaction product resulting from the advancement reaction of
   (a) a polyimide containing at least two radicals of the formula

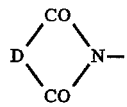

wherein D is a divalent radical containing a C=C bond, and
   (b) from about 0.05 to 2.0 moles per mole of component (a) of an alkenyl phenol, an alkenyl phenol ether or mixtures thereof,
   in the presence of a basic catalyst from about 0.01–0.11 moles per one mole of for each two imide moieties in component (a) of a primary, secondary or tertiary mine, mixed secondary/tertiary amine, heterocyclic base or quaternary ammonium compound as a basic catalyst, said reaction product having a resin melt viscosity of from about 20 to 85 poise as measured on an ICI Cone & Plate Viscometer at 125° C., from which product the catalyst is substantially removed and wherein said reaction takes place in the absence of a polymerization inhibitor;, and B) an effective storage-stabilizing amount of phenothiazine, a phenothiazine derivative or hydroquinone added to component (A) after advancement.

DETAILED DESCRIPTION OF THE INVENTION

Applicable polyimides contain at least two radicals of the formula

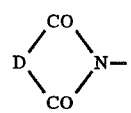

wherein D is a divalent radical containing a C=C bond. These polyimides are known compounds and are described, for example, in U.S. Pat. No. 4,100,140. They are preferably polyimides of the formula

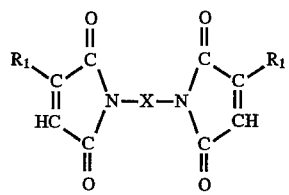

wherein $R_1$ is hydrogen or methyl and X is a divalent organic radical with 2–30 carbon atoms and, more particularly, $C_xH_{2x}$— with x=2–20, —$CH_2CH_2SCH_2CH_2$—, phenylene, naphthalene, xylylene, cyclopentylene, 1,5,5-trimethyl-1,3-cyclohexylene, 1,4-cyclohexylene, 1,4-bis-(methylene)-cyclohexylene, and groups of the formula

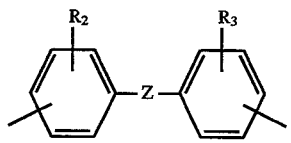

wherein $R_2$ and $R_3$ independently are chlorine, bromine, methyl, ethyl or hydrogen, and Z is a direct bond or methylene, 2,2-propylidene, —CO—, —O—, —S—, —SO— or —$SO_2$—. Bismaleimides which are particularly preferred are those in which $R_1$ is hydrogen, X is hexamethylene, trimethylhexamethylene, 1,5,5-trimethyl-1,3-cyclohexylene, or a group of the indicated formula in which Z is methylene, 2,2-propylidene or —O—.

The substances which follow may be mentioned as specific examples of known polyimides which are suitable for use in this invention: N,N'-ethylene-bis-maleimide, N,N'-hexamethylene-bis-maleimide, N,N'-m-phenylene-bis-maleimide, N,N'-p-phenylene-bis-maleimide, N,N'-4,4'-diphenylmethane-bis-maleimide (this is preferably employed), N,N'-4,4'-3,3'-dichloro-diphenylmethane-bis-maleimide, N,N'-4,4'-(diphenyl ether)-bis-maleimide, N,N'-4,4'-di-phenylsulphone-bis-maleimide, N,N'-4,4'-dicyclohexylmethane-bis-maleimide, N,N'-α,4,4'-dimethylenecyclohexane-bis-maleimide, N,N'-m-xylylene-bis-maleimide, N,N'-p-xylylene-bis-maleimide, N,N'-4,4'-diphenylcyclohexane-bis-maleimide, N,N'-m-phenylene-bis-citraconimide, N,N'-4,4'-diphenylmethane-bis-citraconimide, N,N'-4,4'-2,2-diphenylpropane-bis-maleimide, N,N'-α,1,3-dipropylene-5,5-dimethyl-hydantoin-bis-maleimide, N,N'-4,4'-diphenylmethane-bis-itaconimide, N,N'-p-phenylene-bis-itaconimide, N,N'-4,4'-diphenylmethane-bis-dimethylmaleimide, N,N'-4,4'-2,2'-diphenylpropane-bis-dimethylmaleimide, N,N'-hexamethylene-bis-dimethylmaleimide, N,N'-4,4'-(diphenyl ether)-bis-dimethylmaleimide and N,N'-4,4'-diphenylsulphone-bis-dimethylmaleimide.

According to the invention, allylphenols and methallylphenols, or the ethers thereof, are preferably employed as the alkenylphenols are alkenylphenol ethers.

Both mononuclear and polynuclear, preferably binuclear, alkenylphenols and alkenylphenol ethers can be employed. Preferably, at least one nucleus contains both an alkenyl group and a phenolic, optionally etherified, OH group.

As is known, alkenylphenols are manufactured by rearrangement of the alkenyl ethers of phenols (for example of the allyl ether of phenol) by the action of heat (Claisen rearrangement). These alkenyl ethers are also obtained according to known processes by reacting phenols and, for example, allyl chloride in the presence of an alkali metal hydroxide and solvents. As is known, a condensation reaction takes place (elimination of an alkali metal chloride).

Typical examples are:
Compounds of formula I

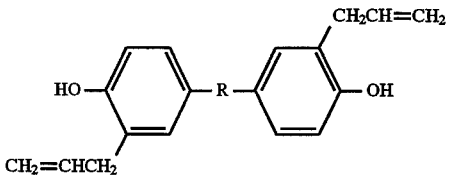

wherein R is a direct bond, methylene, isopropylidene, —O—, —S—, —SO— or —SO$_2$; Propenyl-substituted phenols of formula II

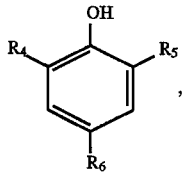

wherein $R_4$, $R_5$ and $R_6$ are each independently a hydrogen atom or $C_2$–$C_{10}$alkenyl, preferably, an allyl or propenyl group, with the proviso that at least one of $R_4$ to $R_6$ is alkenyl, preferably a propenyl group;

Compounds of formula III

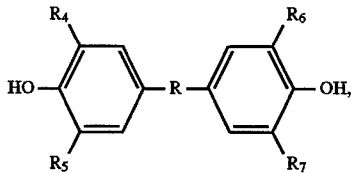

wherein $R_4$, $R_5$, $R_6$ and $R_7$ are each independently a hydrogen atom or $C_2$–$C_{10}$alkenyl, preferably an allyl or propenyl group, with the proviso that at least one of $R_4$ to $R_7$ is alkenyl, preferably a propenyl group, and R is as defined for formula I; and Compounds of formula IV

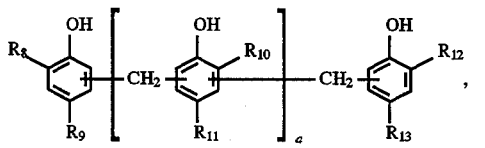

wherein $R_8$, $R_9$, $R_{10}$, $R_{11}$, $R_{12}$ and $R_{13}$ are each independently a hydrogen atom, $C_1$–$C_4$alkyl, $C_2$–$C_{10}$alkenyl, preferably allyl or propenyl, with the proviso that at least one of $R_8$ to $R_{13}$ is alkenyl, preferably a propenyl group, and a is a value from 0 to 10.

Compounds of formula III are preferred in which each of $R_4$ and $R_6$ is a propenyl group and each of $R_5$ and $R_7$ is a hydrogen atom and R is methylene, isopropylidene or —O—.

It is also possible to use mixtures of isomers of propenyl- and allyl-substituted mono- or polyhydric phenols. Among the mixtures of isomers it is preferred to use mixtures of propenyl- and allyl-substituted phenols of formula III, preferably those which are obtained by partial isomerization of allyl-substituted phenols of formula IIIa

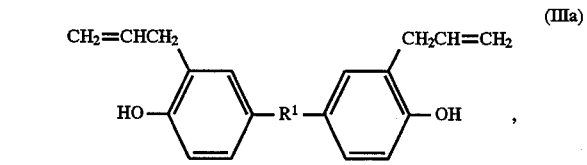

wherein $R^1$ is methylene, isopropylidene or —O—.

According to the invention, the use of mixtures of polynuclear alkenylphenols and/or alkenylphenol ethers with mononuclear alkenylphenols and/or alkenylphenol ethers also gives good results. The alkenylphenol ethers preferably employed are those substances which contain one or more molecular radicals of the formula V

in which $R_3$ denotes an alkyl radical with 1 to 10 C atoms, an aryl radical or an alkenyl radical, preferably allyl or methallyl, the O atom in formula V representing the phenolic ether bridge.

A further embodiment of the invention is the use of mixtures of those substances which contain only one OH group and only one alkenyl group on the aromatic nucleus with substances which contain several OH groups and/or several alkenyl groups on the aromatic nucleus, or of mixtures of the corresponding phenol ethers of these substances. The corresponding methallyl compounds can also be used.

Such alkenyl-substituted phenols and polyols are disclosed for e.g. in U.S. Pat. Nos. 4,100,140 and 4,371,719.

Typical materials include O,O'-diallyl-bisphenol A, 4,4'-dihydroxy-3,3'-diallyldiphenyl, bis(4-hydroxy-3-allylphenyl)methane, 2,2-bis(4-hydroxy-3,5-diallylphenyl)propane, eugenol, O,O'-dimethallyl-bisphenol A, 4,4'-dihydroxy-3,3'-dimethallyldiphenyl, bis(4-hydroxy-3-methallylphenyl)methane, 2,2-bis(4-hydroxy-3,5-dimethallylphenyl)-propane, 4-methallyl-2-methoxyphenol, 2,2-bis(4-methoxy-3-allylphenyl)propane, 2,2-bis(4-methoxy-3-methallylphenyl)propane, 4,4'-dimethoxy-3,3'-diallyldiphenyl, 4,4'-dimethoxy-3,3'-dimethallyldiphenyl, bis(4-methoxy-3-allylphenyl)methane, bis(4-methoxy-3-methallylphenyl)methane, 2,2-bis(4-methoxy-3,5-diallylphenyl)propane, 2,2-bis(4-methoxy-3,5-dimethallylphenyl)propane, 4-allylveratrole and 4-methallyl-veratrole.

In terms of relative concentration, the alkenyl phenol component or a mixture thereof is employed in a range of 0.05 to 2.0 moles per mole of maleimide, and preferably in a range of 0.1 to 1.0, and most preferably in a 1:1 molar ratio.

The resin system further comprises either ionic or free-radical polymerization catalysts. These should be present in a concentration of 0.1 to 10% by weight, preferably 0.1 to 5% by weight, based on the total amount of the reactants.

Amongst the ionic catalysts, those which are suitable according to the invention are, in particular, tertiary, secondary and primary mines or amines which contain several amino groups of different types (for example mixed tertiary/secondary amines) and quaternary ammonium compounds. These amine catalysts can be either monoamines or polyamines. When primary and secondary amines are used, monoamines are to be preferred. The substances which follow are to be listed as examples of such amine catalysts: diethylamine, tripropylamine, tributylamine, triethylamine, triamylamine, benzylamine, tetramethyldiaminodiphenylmethane, N,N-diisobutylaminoacetonitrile, N,N-dibutylaminoacetonitrile, heterocyclic bases, such as quinoline, N-methylpyrrolidine, imidazole, benzimidazole and their homologues, and also mercaptobenzothiazole. Examples of suitable quaternary ammonium compounds which may be mentioned are benzyltrimethylammonium hydroxide and benzyltrimethylammonium methoxide. Tripropylamine is preferred.

Further suitable ionic catalysts are alkali metal compounds, such as alkali metal alcoholates and alkali metal hydroxides. Sodium methylate is particularly suitable.

Suitable free-radical polymerization catalysts are the known organic peroxides and hydroperoxides as well as azoisobutyronitrile. In this case also, the preferred concentration is 0.1 to 5.0% by weight.

Further polymerization catalysts which can be employed for the process according to the invention are acetylacetonates, especially the acetyl-acetonates of the transition metals. The corresponding vanadium compound is to be singled out in particular. These special polymerization catalysts are also employed in the concentration already mentioned above.

Phenothiazine itself has been found to be an especially good stabilizer. The phenothiazine preferably used in this invention is of the following formula

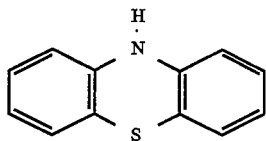

In addition, C-substituted phenothiazines which have one to three substituents and N-substituted phenothiazines which have one substituent selected from the group consisting of $C_1$–$C_6$ alkyl; for example, 3-methyl-phenothiazine, 3-ethyl-phenothiazine, 10-methyl-phenothiazine; aryl, for example, 3-phenyl-phenothiazine, 3,7-diphenyl-phenothiazine; halogen, such as chlorine, bromine and iodine; for example, 3-chlorophenothiazine, 2-chlorophenothiazine, 3-bromophenothiazine; nitrogen functional groups, for example, 3-nitrophenothiazine, 3-aminophenothiazine, 3,7-diaminophenothiazine; and sulfur functional groups, for example, 3-sulfonyl-phenothiazine, 3,7-disulfonyl-phenothiazine, 3,7-dithiocyanatophenthiazine are also useful inhibitors of the invention. Furthermore, N,N' dimers of phenothiazine and substituted N,N' dimers of phenothiazine are also useful inhibitors of the invention. Preferable phenothiazines contain from 0 to 1 substituents.

The phenothiazines and hydroquinone are generally used in an amount ranging from about 0.5 to about 10 parts per hundred of resin and preferably in an amount ranging from about 1.5 to about 2 parts per hundred of resin.

The method of preparation of the reaction products of the present invention is established in order to obtain prepolymers of predetermined advancement, as set forth in U.S. Pat. No. 5,189,128, as cited above. A key element is the amount of catalyst utilized in the advancement reaction. The applicable concentrations of catalyst are set forth hereinabove. In selecting the reaction conditions, a practitioner must strike a balance between catalyst concentration and the other process variables inasmuch as higher catalyst concentrations tend to maximize the increase in solution stability while lower amounts within the range will improve other characteristics in preference to solution stability. This balancing of variables will also permit the use of catalyst concentrations somewhat beyond the lower and upper limits. However, catalyst concentrations falling significantly below the minimum concentration do not yield resins with improved solution or storage stability, while catalyst concentrations substantially exceeding the prescribed maximum will tend to gel the resin solution during preparation or to produce resins with high resin solution viscosities and with inferior mechanical and thermal properties.

Correspondingly, the degree of resin advancement is a function of reaction time and temperature after catalyst addition. This advancement parameter is to be monitored by the measurement of resin melt viscosity. Resin melt viscosity is measured with an ICI Cone & Plate Viscometer using a 0–100 poise scale at 125° C. and will generally range from 20 to 85 poise, and preferably 50–70 poise, for the advanced resin systems. Gel time may be used as an additional parameter and reflects the time to total gel formation as determined at a temperature of 170° C. and will generally range from about 80 to 550 seconds for the advanced resin systems of this invention.

Essential to the production of a storage-stable advanced polymaleimide prepreg composition is the timing of the step in which phenothiazine, a phenothiazine derivative or hydroquinone is added to the system. The addition of the phenothiazine or hydroquinone stabilizer is performed after, not before, the prepolymer advancement reaction. It was found that the addition of the phenothiazine after the prepolymer advancement reaction unexpectedly increases storage-stability of the advanced polymaleimide composition and also extends the gel time of the prepolymer by 30%. A longer gel time is more advantageous for future processing in coating operations. In addition, the stabilizers can be used as an in-process control parameter to obtain the desired reactivity of the prepolymer.

The advancement procedure thus involves blending the polyimide and the alkenylphenol or alkenylphenol ether and heating the blend at a temperature of from 25° to 125° C. until a clear melt is obtained. Thereafter, the catalyst is added and the reaction continued for the appropriate amount of time at temperatures ranging from 110° to 130° C. until the advanced polymaleimide prepolymer is obtained. It is not until this advancement reaction is complete that phenothiazine, a phenothiazine derivative or hydroquinone is added to the bismaleimide prepolymer. Thus, the phenothiazine in an amount set forth hereinbefore dissolved in the desired solvent system is added to the resin. High solids (up to about 75%, by weight, preferably 60% by weight), generally low viscosity solutions are thus prepared which are directly available for impregnating glass or other fabrics or fibers for laminate preparation. A wide variety of low boiling solvents (boiling points up to about 160° C. and preferably up to about 100° C.) may be used including ketones such as acetone, methyl ethyl ketone and methyl isobutyl ketone; glycol ethers and glycol ether acetates such as propylene glycol monomethyl ether, propylene glycol methyl ether acetate, ethylene glycol methyl ether, ethylene glycol ethyl ether and glycol ethyl ether acetate; hydrocarbons such as toluene and anisole; methoxy propanol; dimethylformamide; and mixtures thereof; with the ketones and ketone/ether blends (preferably 1:1) being of particular interest. Most preferably, methyl ethyl ketone or a mixture of methyl ethyl ketone and propylene glycol monomethyl ether is used. Blends of ketones with certain higher boiling solvents are also applicable.

Prepolymer compositions such as those described above have application in a broad range of end uses such as in printed circuit boards, castings, composites, molding compounds, adhesives and coatings. Thus, the modified resin solutions or melts are utilized to impregnate various fibers or fabrics for eventual use in printed circuit boards or various laminating applications. Preferably, a glass fiber is impregnated. Techniques for preparing laminates are well known. Such laminates may be prepared by compression or autoclave molding and may comprise a broad range of thicknesses. Techniques for preparing prepreg are well known to those skilled in the art. In terms of preparing honeycomb skins and structural parts, graphite, glass and Kevlar reinforced skins and parts as well as others can be readily prepared from the instant systems.

The process for preparing the prepreg product is termed "B Staging" because the prepolymer is advanced to an intermediate stage before final crosslinking. Normally, the prepreg is then stored at below freezing temperatures in order to maintain the properties of the prepreg This is an expensive procedure when large volumes of material are stored in this fashion for extended periods of time. Thus, room temperature storage is much more desired. However, it is well known that the polyimide polymer in the prepreg will continue to advance at room temperature conditions, thus rendering the prepreg useless after a few weeks. Surprisingly, the use of a phenothiazine or hydroquinone inhibitor in this polymer resin system solves this problem. The phenothiazine, used in accordance with the instant invention, retards the oxidation and advancement reactions in the prepreg, thus creating the ability for the material to be stored at room temperature conditions at a much lower cost.

During the coating and "B staging" operation for manufacturing prepreg, the resin solution is heated to advance the polymer to the desired stage, and also to remove the solvents from the material. The phenothiazine must remain in the prepreg during the heating and solvent evaporation stage in order to be an effective stabilizer during storage. Thus, the phenothiazine additive was chosen because of its high boiling point for this operation, and levels were optimized to maintain a minimum amount in the final prepreg. During this experimentation, it was also found that the use of phenothiazine unexpectedly improved other processing properties. The phenothiazine extended the gel reactivity of the prepreg by 30%, reduced the volatile solvents in the prepreg by 20–30% and reduced post cure times by 10%. All these improvements are extremely desirable characteristics for processing, which improve yields, and reduce cost.

In a preferred embodiment, the polyimide solution (60% solids) is diluted with an appropriate solvent to give the desired solution viscosity range. A glass fabric with the appropriate adhesion promoter is dipped into the resin solution in order to impregnate the fabric. The fabric is then heated in an oven at 150°–170° C. to remove the volatile solvents and to advance the resin to the desired flow and gel reactivity stage. The prepregs can then later be compression molded at 177° C. for 3 hours and post-cured for 4 hours at 240° C. to form the final composite laminate.

The prepolymers prepared according to the invention can furthermore be mixed, at any stage before cure, with usual modifiers such as extenders, fillers and reinforcing agents, pigments, dyestuffs, organic solvents, plasticizers, tackifiers, rubbers, accelerators, diluents and the like. As extenders, reinforcing agents, fillers and pigments which can be employed in the curable mixtures according to the invention there may be mentioned, for example: coal tar, bitumen, glass fibers, boron fibers, carbon fibers, cellulose, polyethylene powder, polypropylene powder, mica, asbestos, quartz powder, gypsum, antimony trioxide, bentones, silica aerogel ("aerosil"), lithopone, barite, titanium dioxide, carbon black, graphite, iron powder. It is also possible to add other usual additives, for example, flameproofing agents, for conferring thixotropy, flow control agents such as silicones, cellulose acetate butyrate, polyvinyl butyrate, waxes, stearates and the like (which are in part also used as mold release agents) to the curable mixtures.

The storage-stable advanced polymaleimide compositions in accordance with the present invention produce prepregs which can be stored at room temperature without adverse effects on processing conditions and result in improved coating and processing conditions.

The following examples illustrate the preferred embodiments of this invention and are intended for non-limitative purposes. In these examples, all parts given are by weight unless otherwise noted.

EXAMPLE 1

This example illustrates the preparation of a typical storage stable advanced bismaleimide composition of the present invention.

| Formulation | Parts by Weight |
| --- | --- |
| Bismaleimidodiphenylmethane | 31.9 |
| Diallyl Bisphenol A | 27.3 |
| Tripropylamine | 0.38 |
| Phenothiazine | 1.0 |
| Methyl Ethyl Ketone | 19.7 |
| Propylene Glycol Monomethyl Ether | 19.7 |

Bismaleimidodiphenylmethane and diallyl bisphenol A are added and mixed together in a reaction flask and heated to 120° C.–135° C. Tripropylamine is added to the flask, and stirring is continued for 2 hours. Samples are then removed from the flask and tested for their melt viscosity at 125° C. and their gel time at 171° C. When the melt viscosity of the resin reaches 40 poise, methyl ethyl ketone, methoxy propanol and phenothiazine are added to the reaction flask with continued stirring for a period of 2–4 hours to form the advanced prepolymer product which is discharged from the reaction flask. The advanced prepolymer product has a solids content of 60.0%, a gel time of 340 secs at 171° C. and a viscosity of 300 cps at 25° C.

EXAMPLE 2

This example illustrates the preparation of a typical prepreg and laminate therefrom in accordance with the present invention.

The advanced prepolymer product of Example 1 is coated onto a woven glass fabric from Clark-Schwebel (Anderson, S.C.). The fabric style is 7628 with a CS 309 finish. The material is B-staged at 190° C. for 3 minutes. The resulting prepreg has a resin content of 40%, a volatile content of 0.9%, gel reactivity at 171° C. of 190 secs and prepreg stability at 25° C. of >6 months.

The prepreg is then hydraulically pressed together with copper foil at 177° C. for 3 hours and post-cured at 240° C. for 4 hours. The finished laminate has the following properties:

| Laminate Properties | |
| --- | --- |
| Glass transition temperature | 265° C. |
| Decomposition temperature | 410° C. |
| *CTE (Z Axis) | 39 ppm/C |
| Solder dip resistance | >10 min. |
| Peel Strength | 9.0 lbs/in |
| Dielectric Constant | 4.4 |
| Dissipation factor | 0.01 |

*Coefficient of thermal expansion

EXAMPLE 3

Using the procedure provided in Example 1, an advanced bismaleimide prepolymer composition is prepared without the addition of phenothiazine:

| Formulation | Parts by Weight |
| --- | --- |
| Bismaleimidodiphenylmethane | 31.9 |
| Diallyl Bisphenol A | 27.3 |
| Tripropylamine | 0.38 |
| Methyl Ethyl Ketone | 20.0 |
| Propylene Glycol Monomethyl Ether | 20.0 |

The advanced prepolymer product has a gel reactivity of 230 seconds at 171° C., which makes processing more difficult than with the advanced resin product from Example 1.

EXAMPLE 4

Using the procedure provided in Example 2, a prepreg and laminate therefrom are prepared from the advanced resin product of Example 3.

The prepreg has the following properties:

| Prepreg Properties | |
| --- | --- |
| Resin Content | 40% |
| Volatile Content | 2.9% |
| Gel Reactivity | 80 seconds |
| Prepreg stability | 2 weeks |

The prepreg stability at room temperature is extremely limited and the volatile content is high.

The laminate made therefrom exhibits a glass transition temperature of 245° C.

EXAMPLE 5

Using the procedure provided in Example 1, the following formulation is prepared to demonstrate that a minimal amount of phenothiazine is needed to improve processing characteristics. In this example, not enough stability is gained for optimum processing characteristics.

| Formulation | Parts by Weight |
| --- | --- |
| Bismaleimidodiphenylmethane | 32.0 |
| Diallyl Bisphenol A | 27.5 |
| Tripropylamine | 0.38 |
| Phenothiazine | 0.40 |
| Methylethylketone | 19.8 |
| Propylene Glycol Monomethyl Ether | 19.8 |

The advanced resin product has a gel reactivity of 250 seconds.

EXAMPLE 6

Using the procedure provided in Example 2, a prepreg is prepared from the advanced resin product of Example 5.

The prepreg has the following properties:

| Prepreg Properties | |
| --- | --- |
| Resin Content | 40% |
| Volatile Content | 2.0% |
| Gel Reactivity | 98 seconds |
| Prepreg stability | 1 month |

EXAMPLE 7

This Example demonstrates an improvement in gel time for advanced polymaleimide prepolymer compositions according to the instant invention.

The solution samples are prepared as follows:

Solution Sample A: Bismaleimidodiphenylmethane (31.9 parts by weight), diallyl bisphenol A (27.3 parts by weight) and tripropylamine (0.38 parts by weight) are reacted as in Example 1. Methyl ethyl ketone (20.0 parts by weight) is added as the solvent. The advanced prepolymer product containing no additive has a solids content of 75%.

Solution Sample B: To a portion of the Solution Sample A is added indole (0.63 parts by weight, 0.06 mole).

Solution Sample C: To a portion of the Solution Sample B is added hydroquinone (0.59 parts by weight, 0.06 mole).

Solution Sample D: To a portion of the Solution Sample C is added phenothiazine (1.1 parts by weight, 0.06 mole).

The gel time for each solution is measured, and the results are summarized in Table 1.

TABLE I

| TEST RESULTS FOR SOLUTION SAMPLES | |
| --- | --- |
| Solution Sample | Gel Time at 171° C. |
| A (No Additive) | 132 sec. |
| B (Indole Additive) | 128 sec. |
| C (Hydroquinone Additive) | 221 sec. |
| D (Phenothiazine Additive) | 208 sec. |

EXAMPLE 8

Using the procedure provided in Example 2, prepregs are prepared from the advanced prepolymer solution samples of Example 7.

The resulting prepreg products show the following properties, which are summarized in Table 2:

TABLE 2

| | Gel time at 171° C. | | DSC Analysis | |
| --- | --- | --- | --- | --- |
| Prepeg Sample | initial | 1 month storage | initial | 1 month storage |
| A' (No Additive) | 44 sec. | 10 sec. | 133 J/g | 71 J/g |
| B' | 33 sec. | 10 sec. | 144 J/g | 47 J/g |

TABLE 2-continued

TEST RESULTS FOR PRE-PEG SAMPLES

| Prepeg Sample | Gel time at 171° C. initial | 1 month storage | DSC Analysis initial | 1 month storage |
|---|---|---|---|---|
| (Indole Additive) C' | 92 sec. | 93 sec. | 122 J/g | 116 J/g |
| (Hydroquinone Additive) D' | 82 sec. | 86 sec. | 111 J/g | 108 J/g |
| (Phenothiazine Additive) | | | | |

EXAMPLE 9

To demonstrate the criticality of the order in which phenothiazine is added, the following samples are made and tested.

Sample A: N,N'-4,4'-diaminodiphenylmethane-bismaleimide (1 mole) and diallylbisphenol A (1 mole) are added together and heated to 120°–130° C. until a clear homogeneous solution is achieved.

Sample B: N,N'-4,4'-diaminodiphenylmethane-bismaleimide (1 mole), diallylbisphenol A (1 mole) and phenothiazine (0.06 mole) are added together and reacted in the same manner as Sample A.

The resulting resins give the following properties, which are summarized in Table 3:

TABLE 3

TEST RESULTS

| Gel Time at 171° C. (sec.) | | ΔH (J/gm) at 238° C. at 22 days |
|---|---|---|
| | initially | storage |
| Sample A (No Additive) | 1620 | 886 | 248 |
| Sample B (Phenothiazine) | 456 | 265 | 231 |

The above data shows that phenothiazine acts as a catalyst, and not as a stabilizer.

EXAMPLE 10

A propolymer resin is prepared using the general procedure of Example 1 except that the phenothiazine is added at the beginning of the reaction, that is, to the monomeric mixture of bismaleimide, diallyl bisphenol A and the tripropylamine. No solvent is used. The resulting resin exhibits the following properties, as summarized in Table 4.

TABLE 4

| Gel Time at 171° C. (sec.) | Storage (days) |
|---|---|
| 536 | initial preparation |
| 383 | 12 |
| 221 | 34 |

The above data shows that the phenothiazine acts as a catalyst, and not as a stabilizer.

EXAMPLE 10

Solution Sample A: The procedure of Example 1 is followed, except that the resulting advanced prepolymer product has a solids content of 75% solids.

Solution Sample B: The procedure of Example 1 is followed, except that no phenothiazine is added and the resulting prepolymer product has a solids content of 75% solids.

The samples show the following properties, which are summarized in Table 5:

TABLE 5

| Gel Time (days) | A (with phenothiazine) | B (with no phenothiazine) |
|---|---|---|
| Initial | 484 sec. | 183 sec. |
| 23 | 463 sec. | n/a |
| 41 | 390 sec. | n/a |
| 48 | n/a | 54 sec. |

The sample prepared without phenothiazine (Sample B) shows a reactivity loss of 70.5% in 48 days, while the sample prepared with phenothiazine in accordance with the instant invention shows a reactivity loss of only 19.4% in 41 days.

What is claimed is:

1. A storage-stable prepolymer polymaleimide composition comprising:

A) the prepolymer polymaleimide reaction product resulting from the advancement reaction of (a) a polyimide containing at least two radicals of the formula

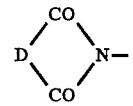

wherein D is a divalent radical containing a C═C bond, and (b) from about 0.05 to 2.0 moles per mole of component (a) of an alkenyl phenol, an alkenyl phenol ether or mixtures thereof, in the presence of from about 0.01–0.11 moles, based on one mole of for each two imide moieties of component (a), of a basic catalyst selected from the group consisting of a primary, secondary or tertiary amine, a mixed secondary/tertiary amine, a heterocyclic base and a quaternary ammonium compound, said reaction product having a resin melt viscosity of from about 20 to 85 poise as measured on an ICI Cone & Plate Viscometer at 125° C., from which product the catalyst is removed and wherein said reaction takes place in the absence of a polymerization inhibitor; and B) an effective storage-stabilizing amount of phenothiazine, a phenothiazine derivative or hydroquinone added to component (A) after prepolymer advancement.

2. A storage-stable prepolymer polymaleimide composition according to claim 1, wherein component (a) is of the formula

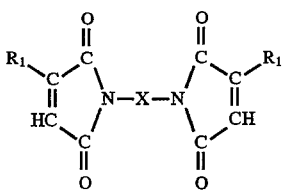

wherein $R_1$ is hydrogen or methyl and X is a divalent organic radical with 2-30 carbon atoms.

3. A storage-stable prepolymer polymaleimide composition according to claim 2, wherein X is $C_xH_{2x}$— with x=2-20, —$CH_2CH_2SCH_2CH_2$, phenylene, naphthalene, xylylene, cyclopentylene, 1,5,5-trimethyl-1,3-cyclohexylene, 1,4-cyclohexylene, 1,4-bis(methylene)-cyclohexylene, and groups of the formula

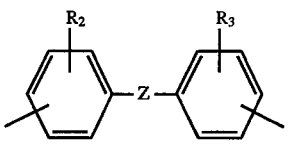

wherein $R_2$ and $R_3$ independently are chlorine, bromine, methyl, ethyl, or hydrogen, and Z is a direct bond or methylene, 2,2-propylidene, —CO—, —O—, —S—, —SO—, or —$SO_2$—.

4. A storage-stable prepolymer polymaleimide composition according to claim 3, wherein $R_1$ is hydrogen, X is a group of the formula

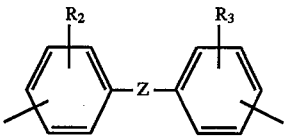

and Z is methylene, 2,2-propylidene or —O—.

5. A storage-stable prepolymer polymaleimide composition according to claim 4, wherein component (a) is 4,4'-bismaleimidodiphenylmethane.

6. A storage-stable prepolymer polymaleimide composition according to claim 1, wherein component (b) is an alkenyl phenol of the formula

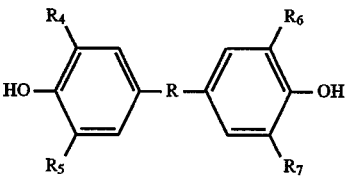

wherein R is a direct bond, methylene, isopropylidene, —O—, —S—, —SO— or —$SO_2$—; and $R_4$, $R_5$, $R_6$ $R_7$ are independently hydrogen or $C_2$-$C_{10}$ alkenyl, with the proviso that at least one of $R_4$-$R_7$ is an alkenyl group;

an alkenyl phenol of the formula

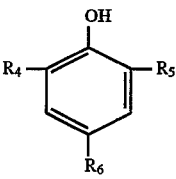

wherein $R_4$, $R_5$ and $R_6$ are independently hydrogen or $C_2$-$C_{10}$ alkenyl, with the proviso that at least one of $R_4$-$R_6$ is alkenyl; or an alkenyl phenol of the formula

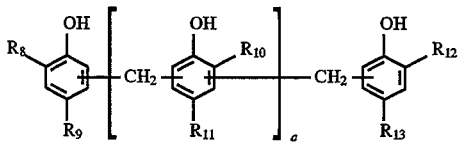

wherein $R_8$, $R_9$, $R_{10}$, $R_{11}$, $R_{12}$ and $R_{13}$ are independently hydrogen, $C_1$-$C_4$ alkyl or $C_2$-$C_{10}$ alkenyl, with the proviso that at least one of $R_8$-$R_{13}$ is alkenyl; or the ether thereof containing at least one —$OR_3$ radical wherein $R_3$ is $C_1$-$C_{10}$ alkyl, aryl or alkenyl, and a is a value from 0 to 10.

7. A storage-stable prepolymer polymaleimide composition according to claim 6, wherein said alkenyl group is allyl or propenyl.

8. A storage-stable prepolymer polymaleimide composition according to claim 7, wherein said alkenyl phenol is O,diallyl-bisphenol A.

9. A storage-stable prepolymer polymaleimide composition according to claim 1 further comprising a non-aqueous solvent having a maximum boiling point of about 160° C.

10. A storage-stable prepolymer polymaleimide composition according to claim 9, wherein said solvent is a ketone, glycol ether, glycol ether acetate, hydrocarbon, dimethylformamide or a mixture thereof.

11. A storage-stable prepolymer polymaleimide composition according to claim 10, wherein methyl ethyl ketone is the solvent.

12. A storage-stable prepolymer polymaleimide composition according to claim 10, wherein a mixture of methyl ethyl ketone and propylene glycol monomethyl ether is the solvent.

13. A storage-stable advanced polymaleimide composition according to claim 1, wherein said phenothiazine derivative is selected from the group consisting of C-substituted phenothiazine which has one to three substituents selected from the group consisting of $C_1$-$C_6$ alkyl, aryl, halogen, nitrogen functional groups and sulfur functional groups; N-substituted phenothiazine which has one substituent selected from the group consisting of $C_1$-$C_6$ alkyl, aryl, olefin, halogen, nitrogen functional groups and sulfur functional groups; and N,N' dimers of phenothiazine.

14. A storage-stable prepolymer polymaleimide composition according to claim 1, wherein component (B) is phenothiazine.

15. A storage-stable prepreg product obtained by performing "B stage" operation on the storage-stable prepolymer polymaleimide composition of claim 1.

16. A laminate or prepreg structure comprising the cured product of a woven fabric or wound yarn impregnated with a composition according to claim 1.

17. A process for preparing a storage-stable prepolymer polymaleimide composition comprising the steps of:

A) obtaining the prepolymer polymaleimide reaction product resulting from the prepolymer advancement reaction of (a) polyimide containing at least two radicals of the formula

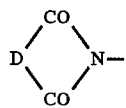

wherein D is a divalent radical containing a C=C bond, and (b) from about 0.05 to 2.0 moles per mole of component (a) of an alkenyl phenol, an alkenyl phenol ether or mixtures thereof, in the presence of from about 0.01–0.11 moles, based on one mole of for each two imide moieties of component (a), of a basic catalyst selected from the group consisting of a primary, secondary or tertiary amine, a mixed secondary/tertiary amine, a heterocyclic base and a quaternary ammonium compound, said reaction product having a resin melt viscosity of from about 20 to 85 poise as measured on an ICI Cone & Plate Viscometer at 125° C., from which product the catalyst is removed and wherein said reaction takes place in the absence of a polymerization inhibitor; and B) adding an effective storage-stabilizing mount of phenothiazine, a phenothiazine derivative or hydroquinone to component (A) after prepolymer advancement.

18. The process of claim 17, wherein the polyimide (a) is 4,4'-bismaleimidodiphenylmethane, (b) is O,diallylbisphenol A and the catalyst is tripropylamine.

19. The process of claim 17 wherein phenothiazine is added in step (B).

20. The process of claim 17 further comprising adding a non-aqueous solvent having a maximum boiling point of about 160° C.

21. The process of claim 20 wherein a ketone, glycol ether, glycol ether acetate, hydrocarbon, dimethylformamide or a mixture thereof is added as the solvent.

22. The process of claim 21 wherein methyl ethyl ketone is added as the solvent.

23. The process of claim 20 further comprising the steps of

C) impregnating a glass fiber containing an appropriate adhesion promoter with said storage-stable prepolymer polymaleimide composition; and D) heating said impregnated glass fiber to about 150° to about 170° C. to move the solvent therefrom and to advance the prepolymer polymaleimide to the desired prepreg.

24. The process of claim 21 wherein a mixture of methyl ethyl ketone and propylene glycol monoethyl ether is added as the solvent.

* * * * *